United States Patent
Huang et al.

(10) Patent No.: US 12,260,799 B2
(45) Date of Patent: Mar. 25, 2025

(54) PIXEL CIRCUIT, DRIVING METHOD THEREOF AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yao Huang, Beijing (CN); Benlian Wang, Beijing (CN); Binyan Wang, Beijing (CN); Weiyun Huang, Beijing (CN); Cong Liu, Beijing (CN); Kai Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/794,130

(22) PCT Filed: Sep. 9, 2021

(86) PCT No.: PCT/CN2021/117473
§ 371 (c)(1),
(2) Date: Jul. 20, 2022

(87) PCT Pub. No.: WO2023/004949
PCT Pub. Date: Feb. 2, 2023

(65) Prior Publication Data
US 2024/0203338 A1  Jun. 20, 2024

(30) Foreign Application Priority Data

Jul. 30, 2021  (WO) ............... PCT/CN2021/109894

(51) Int. Cl.
*G09G 3/20* (2006.01)
*G09G 3/3225* (2016.01)
(Continued)

(52) U.S. Cl.
CPC ......... *G09G 3/2007* (2013.01); *G09G 3/3225* (2013.01); *G09G 3/3233* (2013.01);
(Continued)

(58) Field of Classification Search
CPC ......... G09G 3/32–3291; G09G 3/2007; G09G 2300/0408; G09G 2300/0426;
(Continued)

(56) References Cited

U.S. PATENT DOCUMENTS 6,501,448 B1  12/2002  Komiya et al.
9,691,348 B2   6/2017  Kim et al.
(Continued)

FOREIGN PATENT DOCUMENTS

CN    1435805 A    8/2003
CN  102654975 A    9/2012
(Continued)

OTHER PUBLICATIONS

CN 202180002066.2 first office action.
(Continued)

*Primary Examiner* — Roberto W Flores
(74) *Attorney, Agent, or Firm* — IPro, PLLC

(57) ABSTRACT

In a pixel circuit, a data writing-in circuit is configured to control to connect the data line and the second end of the driving circuit under the control of a first scan signal provided by the first scan line; a reset circuit is configured to control to connect the reset voltage line and the second end of the driving circuit under the control of a third scan signal provided by the third scan line; or control to connect the reset voltage line and the first end of the driving circuit under the control of the third scan signal; a driving circuit is configured to control to connect the first end of the driving circuit and the second end of the driving circuit under the control of a potential of a control end of the driving circuit.

11 Claims, 8 Drawing Sheets

(51) Int. Cl.
  *G09G 3/3233* (2016.01)
  *G09G 3/3258* (2016.01)
  *H10K 59/131* (2023.01)
(52) U.S. Cl.
  CPC ......... *G09G 3/3258* (2013.01); *H10K 59/131* (2023.02); *G09G 2300/0408* (2013.01); *G09G 2300/0426* (2013.01); *G09G 2300/0819* (2013.01); *G09G 2300/0842* (2013.01); *G09G 2300/0852* (2013.01); *G09G 2300/0861* (2013.01); *G09G 2310/0254* (2013.01); *G09G 2310/061* (2013.01); *G09G 2310/08* (2013.01); *G09G 2320/0233* (2013.01); *G09G 2320/0247* (2013.01); *G09G 2320/0252* (2013.01); *G09G 2320/0257* (2013.01); *G09G 2320/045* (2013.01); *G09G 2320/0626* (2013.01)
(58) Field of Classification Search
  CPC ... G09G 2300/0819; G09G 2300/0842; G09G 2300/0852; G09G 2300/0861; G09G 2310/061; G09G 2310/08; G09G 2320/0233; G09G 2320/0247; G09G 2320/0252; G09G 2320/0257; G09G 2320/045; G09G 2320/0626; G09G 2310/0251; G09G 2310/0262; G09G 3/2074; H10K 59/131
  See application file for complete search history.

(56) References Cited

U.S. PATENT DOCUMENTS

| | | |
|---|---|---|
| 11,049,458 B1 | 6/2021 | Fan et al. |
| 2002/0089291 A1 | 7/2002 | Kaneko et al. |
| 2003/0142052 A1 | 7/2003 | Matsumoto |
| 2010/0141644 A1 | 6/2010 | Lee et al. |
| 2012/0147060 A1 | 6/2012 | Jeong |
| 2013/0057532 A1 | 3/2013 | Lee et al. |
| 2013/0127818 A1 | 5/2013 | Tsai et al. |
| 2014/0049568 A1 | 2/2014 | Qi et al. |
| 2015/0054812 A1 | 2/2015 | Jeon |
| 2015/0170576 A1 | 6/2015 | Bae |
| 2015/0348466 A1 | 12/2015 | Park et al. |
| 2015/0379930 A1* | 12/2015 | Lee ................ G09G 3/3233 345/76 |
| 2016/0012775 A1 | 1/2016 | Jeong et al. |
| 2016/0078809 A1 | 3/2016 | Yoon et al. |
| 2017/0162145 A1 | 6/2017 | Huang et al. |
| 2017/0301293 A1 | 10/2017 | Zhu et al. |
| 2017/0358261 A1 | 12/2017 | Zhou |
| 2018/0033370 A1 | 2/2018 | Zheng |
| 2018/0040275 A1 | 2/2018 | Wu |
| 2018/0130410 A1 | 5/2018 | Gao et al. |
| 2018/0158407 A1 | 6/2018 | Chai et al. |
| 2018/0166021 A1 | 6/2018 | Xi et al. |
| 2018/0166025 A1 | 6/2018 | Zhou et al. |
| 2018/0374421 A1 | 12/2018 | Chen et al. |
| 2019/0057646 A1 | 2/2019 | Lin et al. |
| 2019/0189053 A1 | 6/2019 | Kim et al. |
| 2019/0213958 A1 | 7/2019 | Cho et al. |
| 2019/0221165 A1 | 7/2019 | Park et al. |
| 2019/0237019 A1 | 8/2019 | Gao et al. |
| 2019/0295473 A1 | 9/2019 | Lu et al. |
| 2020/0372854 A1 | 11/2020 | Nam |
| 2021/0020109 A1 | 1/2021 | Lin et al. |
| 2021/0049959 A1 | 2/2021 | Park et al. |
| 2021/0104196 A1 | 4/2021 | Yuan |
| 2021/0118361 A1 | 4/2021 | Li |
| 2021/0125543 A1 | 4/2021 | Kim et al. |
| 2021/0134219 A1 | 5/2021 | Huang et al. |
| 2021/0134224 A1* | 5/2021 | He ................ H10K 59/1216 |
| 2021/0167161 A1 | 6/2021 | Yang et al. |
| 2021/0225282 A1 | 7/2021 | Cho et al. |
| 2021/0264862 A1 | 8/2021 | Wang |
| 2021/0327344 A1 | 10/2021 | Dong |
| 2021/0327352 A1 | 10/2021 | Zhang et al. |
| 2021/0335260 A1 | 10/2021 | Wang et al. |
| 2021/0375198 A1 | 12/2021 | Zhang et al. |
| 2021/0383743 A1 | 12/2021 | Yuan |
| 2021/0407383 A1 | 12/2021 | Lai et al. |
| 2021/0407386 A1 | 12/2021 | Li et al. |
| 2021/0407390 A1 | 12/2021 | Li et al. |
| 2022/0020330 A1 | 1/2022 | Cao et al. |
| 2022/0172681 A1* | 6/2022 | Kim ................ G09G 3/3266 |
| 2022/0180811 A1* | 6/2022 | Kim ................ G09G 3/3233 |
| 2022/0319417 A1 | 10/2022 | Liu et al. |
| 2023/0008643 A1* | 1/2023 | Park ................ G09G 3/3233 |
| 2023/0133704 A1* | 5/2023 | Gai ................ G09G 3/3266 345/691 |
| 2023/0360600 A1* | 11/2023 | Wang ................ G09G 3/3233 |

FOREIGN PATENT DOCUMENTS

| | | |
|---|---|---|
| CN | 104200771 A | 12/2014 |
| CN | 104485071 A | 4/2015 |
| CN | 106558287 A | 4/2017 |
| CN | 106910460 A | 6/2017 |
| CN | 107068060 A | 8/2017 |
| CN | 107256695 A | 10/2017 |
| CN | 107274830 A | 10/2017 |
| CN | 107358918 A | 11/2017 |
| CN | 107492351 A | 12/2017 |
| CN | 107507568 A | 12/2017 |
| CN | 107610651 A | 1/2018 |
| CN | 107665672 A | 2/2018 |
| CN | 107799062 A | 3/2018 |
| CN | 207082320 U | 3/2018 |
| CN | 108133687 A | 6/2018 |
| CN | 108320710 A | 7/2018 |
| CN | 108538243 A | 9/2018 |
| CN | 108777127 A | 11/2018 |
| CN | 108877655 A | 11/2018 |
| CN | 109243369 A | 1/2019 |
| CN | 109285500 A | 1/2019 |
| CN | 109599062 A | 4/2019 |
| CN | 109801592 A | 5/2019 |
| CN | 109887464 A | 6/2019 |
| CN | 109949743 A | 6/2019 |
| CN | 110047428 A | 7/2019 |
| CN | 110047432 A | 7/2019 |
| CN | 110070826 A | 7/2019 |
| CN | 110223636 A | 9/2019 |
| CN | 111063301 A | 4/2020 |
| CN | 111354307 A | 6/2020 |
| CN | 111383597 A | 7/2020 |
| CN | 111402810 A | 7/2020 |
| CN | 111435587 A | 7/2020 |
| CN | 111445848 A | 7/2020 |
| CN | 111489701 A | 8/2020 |
| CN | 111613177 A | 9/2020 |
| CN | 111696484 A | 9/2020 |
| CN | 111710303 A | 9/2020 |
| CN | 111754921 A | 10/2020 |
| CN | 111968564 A | 11/2020 |
| CN | 111986622 A | 11/2020 |
| CN | 112102785 A | 12/2020 |
| CN | 112116890 A | 12/2020 |
| CN | 112133242 A | 12/2020 |
| CN | 112397028 A | 2/2021 |
| CN | 112599099 A | 4/2021 |
| CN | 112634832 A | 4/2021 |
| CN | 112735314 A | 4/2021 |
| CN | 112785958 A | 5/2021 |
| CN | 112802431 A | 5/2021 |
| CN | 112908246 A | 6/2021 |
| CN | 113140179 A | 7/2021 |
| CN | 113160740 A | 7/2021 |
| CN | 113851083 A | 12/2021 |
| CN | 114222615 A | 3/2022 |
| CN | 114258320 A | 3/2022 |
| CN | 114514573 A | 5/2022 |
| EP | 3675099 B1 | 8/2022 |
| JP | 2000221903 A | 8/2000 |

(56) References Cited

FOREIGN PATENT DOCUMENTS

| | | | |
|---|---|---|---|
| JP | 2015132738 | A | 7/2015 |
| KR | 20120064493 | A | 6/2012 |
| KR | 20130026338 | A | 3/2013 |
| KR | 20130055450 | A | 5/2013 |
| KR | 20150064543 | A | 6/2015 |
| KR | 20150073420 | A | 7/2015 |
| WO | 2019242557 | A1 | 12/2019 |
| WO | 2020124759 | A1 | 6/2020 |
| WO | 2020258421 | A1 | 12/2020 |
| WO | 2022061852 | A1 | 3/2022 |

OTHER PUBLICATIONS

PCT/CN2021/109894 international search report and written opinion.
PCT/CN2022/103292 international search report and written opinion.
PCT/CN2022/104654 international search report and written opinion.
PCT/CN2022/105457 international search report and written opinion.
PCT/CN2022/105458—written opinion + ISR.
U.S. Appl. No. 18/273,201 non-final office action dated May 22, 2024.
U.S. Appl. No. 18/014,763 non-final office action dated Jul. 3, 2024.
U.S. Appl. No. 18/548,974 Non-Final Rejection dated Oct. 25, 2024.
CN 202110898740.1 first office action dated Dec. 6, 2024.
CN 202110897625.2 first office action dated Dec. 20, 2024.

\* cited by examiner

PIXEL CIRCUIT, DRIVING METHOD THEREOF AND DISPLAY DEVICE

CROSS-REFERENCE TO RELATED APPLICATION

This application is the U.S. national phase of PCT Application No. PCT/CN2021/117473 filed on Sep. 9, 2021, which claims the priority of PCT Application No. PCT/CN2021/109894 filed on Jul. 30, 2021, which are incorporated herein by reference in their entireties.

TECHNICAL FIELD

The present disclosure relates to the field of display technology, and more particularly to a pixel circuit, a driving method thereof and a display device.

BACKGROUND

With the popularity of active-matrix organic light-emitting diode (AMOLED) displays in the mid-to-high-end market, the quality requirements of AMOLED displays are getting higher and higher, and higher design requirements are also proposed.

In the pixel circuit included in the AMOLED display screen, after the driving transistor operates at a certain bias voltage for a period of time, its characteristics will shift, that is, hysteresis, which will lead to short-term afterimages and slow response times.

SUMMARY

The present disclosure provides a pixel circuit, a driving method thereof and a display device.

A first aspect of the present disclosure provides a pixel circuit, comprising: a driving circuit, a data writing-in circuit and a reset circuit, wherein the data writing-in circuit is respectively coupled to a first scan line, a data line and a second end of the driving circuit, and is configured to control to connect the data line and the second end of the driving circuit under the control of a first scan signal provided by the first scan line: the reset circuit is respectively coupled to a third scan line, a reset voltage line and the second end of the driving circuit, and is configured to control to connect the reset voltage line and the second end of the driving circuit under the control of a third scan signal provided by the third scan line: or, the reset circuit is coupled to the third scan line, the reset voltage line and a first end of the driving circuit, is configured to control to connect the reset voltage line and the first end of the driving circuit under the control of the third scan signal: the driving circuit is configured to control to connect the first end of the driving circuit and the second end of the driving circuit under the control of a potential of a control end of the driving circuit.

Optionally, the pixel circuit further comprises: a compensation control circuit, a first initialization circuit and a third initialization circuit: the compensation control circuit is respectively electrically connected to a second scan line, the control end of the driving circuit and the first end of the driving circuit, is configured to control to connect the control end of the driving circuit and the first end of the driving circuit under the control of a second scan signal provided by the second scan line: the first initialization circuit is respectively coupled to the second scan line, a first initialization voltage line and a connection node, and is configured to control to connect the first initialization voltage line and the connection node under the control of the second scan signal: the third initialization circuit is respectively coupled to a second light-emitting control line, the control end of the driving circuit and the connection node, and is configured to control to connect the control end of the driving circuit and the connection node under the control of a second light-emitting control signal provided by the second light-emitting control line.

Optionally, the pixel circuit further comprises: a compensation control circuit, a first initialization circuit and a third initialization circuit: the compensation control circuit is electrically connected to the second scan line, the control end of the driving circuit and the first end of the driving circuit, respectively, is configured to control to connect the control end of the driving circuit and the first end of the driving circuit under the control of the second scan signal provided by the second scan line; the first initialization circuit is respectively coupled to the second scan line, a first initialization voltage line and a connection node, and is configured to control to connect the first initialization voltage line and the connection node under the control of the second scan signal: the third initialization circuit is respectively coupled to a second light-emitting control line, and the first end of the driving circuit and the connection node, and is configured to connect the first end of the driving circuit and the connection node under the control of a second light-emitting control signal provided by the second light-emitting control line.

Optionally, the pixel circuit further comprises: a light-emitting control circuit, an energy storage circuit and a light-emitting element: the light-emitting control circuit is respectively coupled to a first light-emitting control line, the first end of the driving circuit and the light-emitting element, and is configured to control to connect the first end of the driving circuit and the light-emitting element under the control of a first light-emitting control signal provided by the first light-emitting control line: the energy storage circuit is respectively coupled to the control end of the driving circuit and a first voltage line.

Optionally, the light-emitting control circuit is further coupled to a second light-emitting control line, the first voltage line and the second end of the driving circuit, respectively, is configured to control to connect the first voltage line and the second end of the driving circuit under the control of the second light-emitting control signal provided by the second light-emitting control line.

Optionally, the pixel circuit further comprises: a second initialization circuit: the second initialization circuit is respectively coupled to the first scan line, the second initialization voltage line and the light-emitting element, and is configured to control to connect the second initialization voltage line and the light-emitting element under the control of the first scan signal.

Optionally, the compensation control circuit includes a first transistor, the first initialization circuit includes a second transistor, the driving circuit includes a third transistor, and the third initialization circuit including a ninth transistor: a gate electrode of the first transistor is coupled to the second scan line, and a first electrode of the first transistor is coupled to a second electrode of the third transistor, a second electrode of the first transistor is coupled to a gate electrode of the third transistor; a gate electrode of the second transistor is coupled to the second scan line, a first electrode of the second transistor is coupled to the first initialization voltage line, and a second electrode of the second transistor is coupled to the connection node: a gate electrode of the ninth transistor is coupled to the second light-emitting control line, a first electrode of the ninth transistor is coupled to the connection node, and a second electrode of the ninth transistor is coupled to a gate electrode of the third transistor.

Optionally, the compensation control circuit comprises a first transistor, the first initialization circuit comprises a second transistor, the driving circuit comprises a third transistor, and the third initialization circuit including a ninth transistor; a gate electrode of the first transistor is coupled to the second scan line, and a first electrode of the first transistor is coupled to a second electrode of the third transistor, a second electrode of the first transistor is coupled to a gate electrode of the third transistor: a gate electrode of the second transistor is coupled to the second scan line, a first electrode of the second transistor is coupled to the first initialization voltage line, and a second electrode of the second transistor is coupled to the connection node: a gate electrode of the ninth transistor is coupled to the second light-emitting control line, a first electrode of the ninth transistor is coupled to the connection node, and a second electrode of the ninth transistor is coupled to a gate electrode of the third transistor.

Optionally, the driving circuit comprises a third transistor, the data writing-in circuit comprises a fourth transistor, and the reset circuit comprises an eighth transistor; a gate electrode of the fourth transistor is coupled to the first scan line, and a first electrode of the fourth transistor is coupled to the data line, a second electrode of the fourth transistor is coupled to a first electrode of the third transistor; and a gate electrode of the eighth transistor is connected to the third scan line, a first electrode of the eighth transistor is coupled to the reset voltage line, a second electrode of the eighth transistor is coupled to a first electrode of the third transistor or a second electrodes of the third transistor.

Optionally, the driving circuit comprises a third transistor, the light-emitting control circuit comprises a fifth transistor and a sixth transistor: the energy storage circuit comprises a storage capacitor: a gate electrode of the fifth transistor is coupled to the second light-emitting control line, and a first electrode of the fifth transistor is coupled to the first voltage line, a second electrode of the fifth transistor is coupled to a first electrode of the third transistor: a gate electrode of the sixth transistor is coupled to the first light-emitting control line, a first electrode of the sixth transistor is coupled to a second electrode of the third transistor, and a second electrode of the sixth transistor is coupled to the light-emitting element: a first electrode plate of the storage capacitor is coupled to the first voltage line, and a second electrode plate of the storage capacitor is coupled to the gate electrode of the third transistor.

Optionally, the second initialization circuit comprises a seventh transistor, a gate electrode of the seventh transistor is coupled to the first scan line, and a first electrode of the seventh transistor is coupled to the second initialization voltage line, and a second electrode of the seventh transistor is coupled to the light-emitting element.

In a second aspect, a display device includes the display substrate.

In a third aspect, a driving method is applied to the pixel circuit, a display period includes a bias voltage compensation phase and a writing-in compensation phase, wherein the driving method includes: in the bias voltage compensation phase, controlling, by the reset circuit, to connect the reset voltage line and the second end of the driving circuit under the control of the third scan signal: or control to connect the reset voltage line and the first end of the driving circuit under the control of the third scan signal: in the writing-in compensation phase, controlling, by the data writing-in circuit, to connect the data line and the second end of the driving circuit under the control of the first scan signal.

Optionally, in the bias voltage compensation phase, controlling, the first initialization circuit, to connect the first initialization voltage line and the connection node under the control of the second scan signal: controlling, by the third initialization circuit, to connect the control end of the driving circuit and the connection node under the control of the second light-emitting control signal: controlling, by the light-emitting control circuit, to connect the first voltage line and the second end of the driving circuit under the control of the second light-emitting control signal; controlling, by the compensation control circuit, to connect the control end of the driving circuit and the first end of the driving circuit under the control of the second scan signal: the display period further includes a light-emitting phase after the writing-in compensation phase: the driving method further includes: in the light-emitting phase, controlling, by the light-emitting control circuit, to connect the first voltage line and the second end of the driving circuit under the control of the second light-emitting control signal, and to connect the first end of the driving circuit and the light-emitting element under the control of the first light-emitting control signal, and driving, by the driving circuit, the light-emitting element to emit light.

Optionally, the display period further comprises an initialization phase prior to the bias voltage compensation phase: the driving method further includes: in the initialization phase, controlling, by the first initialization circuit, to connect the first initialization voltage line and the connection node under the control of the second scan signal: controlling, by the third initialization circuit, to connect the first end of the driving circuit and the connection node under the control of the second light-emitting control signal: controlling, by the light-emitting control circuit, to connect the first voltage line and the second end of the driving circuit under the control of the second light-emitting control signal: controlling, by the compensation control circuit, to connect the control end of the driving circuit and the first end of the driving circuit under the control of the second scan signal: the display period further includes a light-emitting phase after the writing-in compensation phase: the driving method further includes: in the light-emitting phase, controlling, by the light-emitting control circuit, to connect the first voltage line and the second end of the driving circuit under the control of the second light-emitting control signal, and to connect the first end of the driving circuit and the light-emitting element under the control of the first light-emitting control signal, and driving, by the driving circuit, the light-emitting element to emit light.

BRIEF DESCRIPTION OF THE DRAWINGS

The accompanying drawings described herein are used to provide a further understanding of the present disclosure and constitute a part of the present disclosure. The exemplary embodiments of the present disclosure are used to explain the present disclosure and do not constitute an improper limitation of the present disclosure.

DETAILED DESCRIPTION

Figure 1:
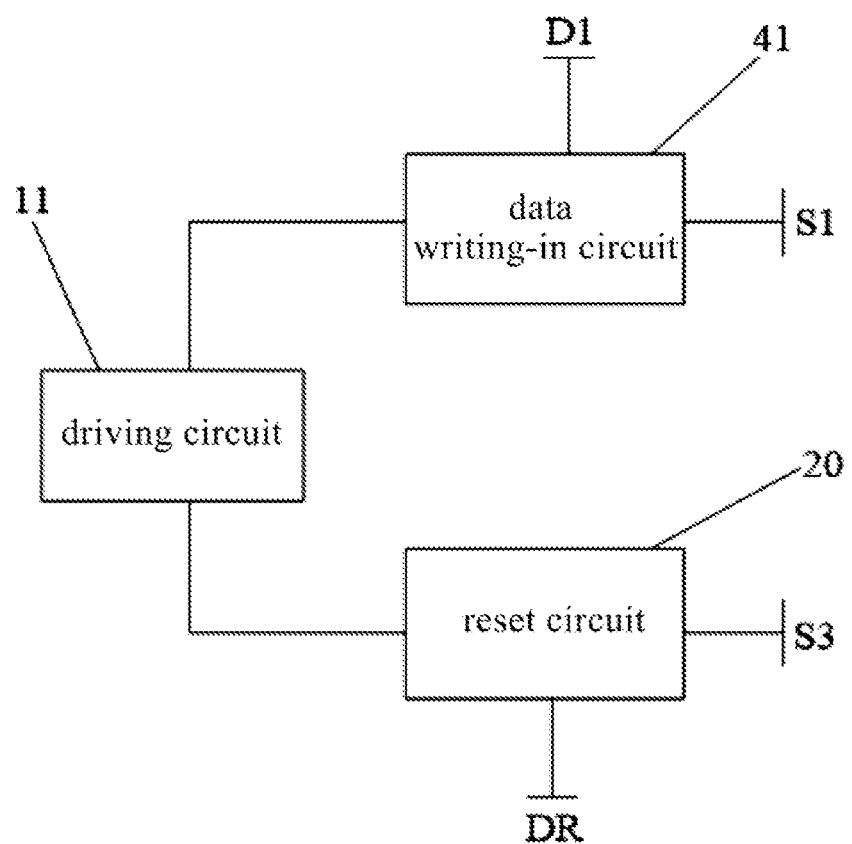
FIG. 1 is a schematic diagram of a first structure of a pixel circuit according to an embodiment of the present disclosure.

In order to further illustrate the pixel circuit, the driving method thereof, and the display device provided by the embodiments of the present disclosure, the following detailed description is given with reference to the accompanying drawings.

In the pixel circuit included in the AMOLED display screen, after the driving transistor operates at a certain bias voltage for a period of time, its characteristics will shift, that is, hysteresis, which will cause that when the screen is switched to another screen after displaying a picture for a period of time, deviation will occur in brightness, resulting in short-term afterimages and slow response time and other defects, the user experience becomes worse.

Referring to FIG. 1, FIG. 2, FIG. 5, FIG. 8 and FIG. 9, an embodiment of the present disclosure provides a pixel circuit, including: a driving circuit 11, a data writing-in circuit 41 and a reset circuit 20;

The data writing-in circuit 41 is respectively coupled to a first scan line S1, a data line D1 and a second end of the driving circuit 11, and is configured to control to connect the data line D1 and the second end of the driving circuit 11 under the control of a first scan signal provided by the first scan line S1;

The reset circuit 20 is respectively coupled to a third scan line S3, a reset voltage line DR and the second end of the driving circuit 11, and is configured to control to connect a reset voltage line DR and the second end of the driving circuit 11 (i.e., a second node N2) under the control of a third scan signal provided by the third scan line S3; or, the reset circuit 20 is coupled to the third scan line S3, the reset voltage line DR and a first end of the driving circuit 11 (i.e., a third node N3), is configured to control to connect the reset voltage line DR and the first end of the driving circuit 11 under the control of the third scan signal;

The driving circuit 11 is configured to control to connect the first end of the driving circuit 11 and the second end of the driving circuit 11 under the control of a potential of a control end of the driving circuit.

Exemplarily, the first scan line S1 is used to write the first scan signal, and the data line D1 is used to write a data signal, and the data signal is used for normal display. The third scan line S3 is used to write the third scan signal. The reset voltage line DR is used to provide a reset voltage.

Exemplarily, the reset signal provided by the reset voltage line DR may be a DC signal or an AC signal. It needs to be ensured that when the reset circuit 20 implements the reset function, the reset voltage of the reset signal provided by the reset voltage line DR is a high voltage.

Exemplarily, the reset voltage includes a power supply voltage VDD. In this case, the reset voltage line DR may be coupled to a power supply line for providing the power supply voltage VDD, or the power supply line may be directly multiplexed as the reset voltage line DR.

Exemplarily, when the reset circuit implements the reset function, the reset voltage has a same potential as the high-level of a first light-emitting control signal provided by a first light-emitting control line EM1. Exemplarily, the reset voltage line DR is coupled to the first light-emitting control line EM1; or, the first light-emitting control line EM1 is multiplexed as the reset voltage line DR.

Exemplarily, the pixel circuit is applied to a display device, and the display device further includes a gate driving circuit, the gate driving circuit is connected to a high-level signal line, and the high-level signal line is used to provide a high-level signal VGH. The reset voltage line DR is coupled to the high-level signal line, and the reset voltage has the same voltage value as the high-level signal VGH. Alternatively, the high-level signal line is multiplexed as the reset voltage line DR.

Exemplarily, the reset voltage includes a first initialization voltage. In this case, the reset voltage line DR can be set to be coupled to a first initialization voltage line Vinit1 for providing a first initialization voltage, or the first initialization voltage line Vinit1 is directly multiplexed as the reset voltage line DR.

Exemplarily, the reset voltage is provided to the driving circuit 11, so as to provide a larger Vgs to the driving circuit 11.

Exemplarily, when the reset voltage line DR is coupled to the second end of the driving circuit 11 (i.e., the second node N2), the difference between the reset voltage and the power supply voltage VDD is less than or equal to 3.5 V.

Exemplarily, when the reset voltage line DR is coupled to the first end of the driving circuit 11 (i.e., the third node N3), the difference between the reset voltage and the first initialization voltage is less than or equal to 2V.

Exemplarily, when the first scan signal is at an active level, the data writing-in circuit 41 is configured to connect the data line D1 and the second end of the driving circuit 11 under the control of the first scan signal provided by the first scan line S1. When the first scan signal is at an inactive level, the data writing-in circuit 41 is configured to disconnect the data line D1 from the second end of the driving circuit 11 under the control of the first scan signal provided by the first scan line S1.

Exemplarily, when the third scan signal is at an active level, the reset circuit 20 is configured to connect the reset voltage line DR and the second end or the first end of the driving circuit 11 under the control of the third scan signal. When the third scan signal is at an inactive level, the reset circuit 20 is configured to disconnect the reset voltage line DR from the second end or the first end of the driving circuit 11 under the control of the third scan signal.

Exemplarily, one display period in which the pixel circuit operates includes: a bias voltage compensation phase P2 and a writing-in compensation phase P3.

In the bias voltage compensation phase P2, under the control of the third scan signal, the reset circuit 20 controls to connect the reset voltage line DR and the second end of the driving circuit 11; or under the control of the third scan signal, the reset circuit 20 controls to connect the reset voltage line DR and the first end of the driving circuit 11, so as to write the reset voltage to the first end or the second end of the driving circuit 11;

In the writing-in compensation phase P3, under the control of the first scan signal, the data writing-in circuit 41 controls to connect the data line D1 and the second end of the driving circuit 11, and writes a data signal to the second end of the driving circuit 11.

According to the specific structure of the above pixel circuit, in the pixel circuit provided by the embodiment of the present disclosure, by setting the reset circuit 20, a reset voltage can be applied to the first end or the second end of the driving circuit 11 in the bias voltage compensation phase P2, so that before the data signal is written, the first end or the second end of the driving circuit 11 is reset to eliminate the influence of the previous frame of the picture on the driving circuit 11, and to ensure that the state of the driving circuit is the same when the next frame of picture is written. Therefore, the characteristics of the compensation driving circuit 11 will be shifted after a certain bias voltage is operated for a period of time, so as to improve the short-term afterimage and slow response time and other defects. In addition, when driving at low frequency, the difference in brightness caused by the characteristic shift of the driving circuit 11 in the long-term light-emitting period can be compensated, the Flicker phenomenon of the screen can be improved, the screen quality can be optimized, and the user experience can be improved.

In addition, when the pixel circuit provided by the embodiment of the present disclosure is applied to a display device, a specific bias voltage compensation can be implemented for the driving circuit 11 in each pixel circuit in the display device, which has a good compensation effect.

In addition, since the reset voltage provided by the reset voltage line DR can be adjusted independently, an appropriate bias voltage can be provided to each pixel circuit in the display device as required.

Figure 3:
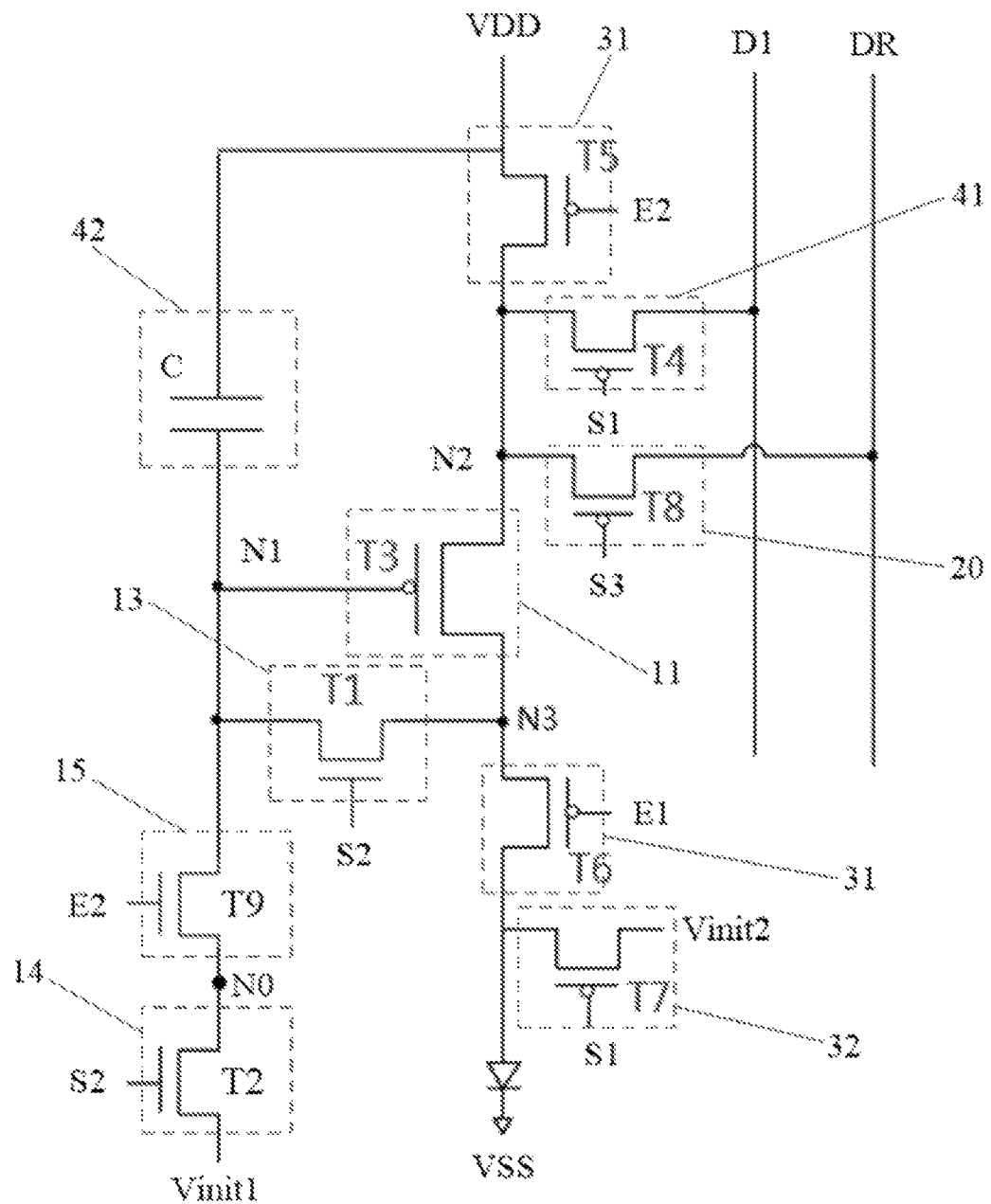
FIG. 3 is a schematic diagram of a first circuit corresponding to FIG. 2.
Figure 4:
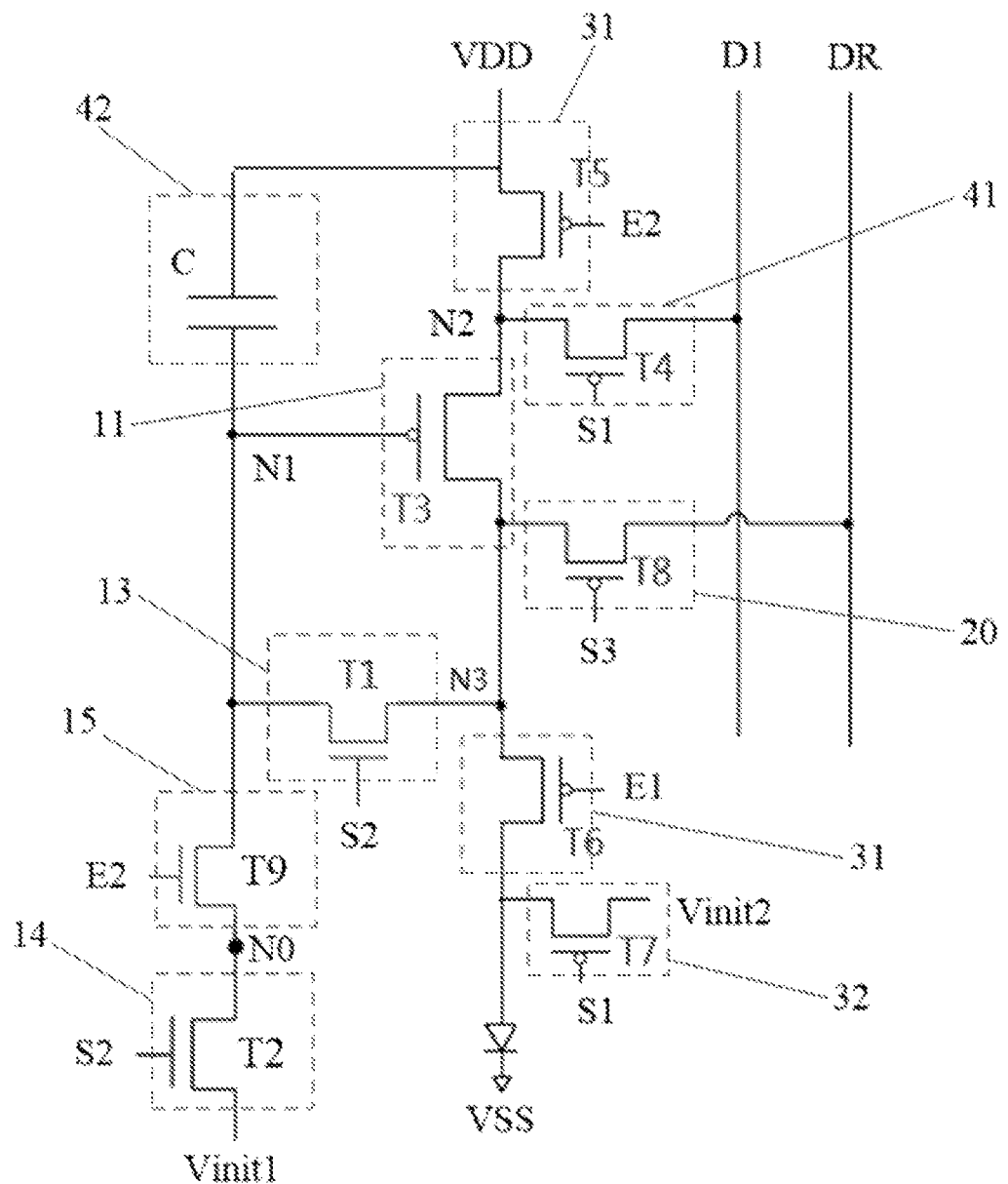
FIG. 4 is a schematic diagram of a second circuit corresponding to FIG. 2.

As shown in FIG. 3, in some embodiments, the pixel circuit further includes: a compensation control circuit 13, a first initialization circuit 14 and a third initialization circuit 15:

The compensation control circuit 13 is respectively electrically connected to the second scan line S2, the control end (i.e. the first node N1) of the driving circuit 11 and the first end (i.e. the third node N3) of the driving circuit 11, is configured to control to connect the control end of the driving circuit 11 and the first end of the driving circuit 11 under the control of the second scan signal provided by the second scan line S2:

The first initialization circuit 14 is respectively coupled to the second scan line S2, the first initialization voltage line Vinit1 and the connection node N0, and is configured to control to connect the first initialization voltage line Vinit1 and the connection node N0 under the control of the second scan signal:

The third initialization circuit 15 is respectively coupled to the second light-emitting control line E2, the control end of the driving circuit 11 and the connection node N0, and is configured to control to connect the control end of the driving circuit 11 and the connection node N0 under the control of the second light-emitting control signal provided by the second light-emitting control line E2.

Exemplarily, the second scan line S2 is configured to write the second scan signal. The display device includes a plurality of pixel circuits arranged in an array, the pixel circuits located in the same row are connected to the same first scan line S1, and the pixel circuits located in the same row are connected to the same second scan line S2. The edge of the display device is provided with a plurality of scanning shift register units (GOAs), and the plurality of scanning shift register units are in one-to-one correspondence with the plurality of second scanning lines S2, and the second scanning lines S2 are coupled to the corresponding shift register units to receive the second scan signal provided by the corresponding shift register unit. Exemplarily, the first scan line S1 is coupled to a shift register unit correspondingly coupled to the next row of pixel circuits adjacent to the first scan line S1. Exemplarily, the first scan line S1 is coupled to the shift register unit correspondingly coupled to the previous row of pixel circuits adjacent to the first scan line S1. This is beneficial to reduce the layout space of the gate driving circuit 11 around the display device, and is beneficial to the narrowing of the frame of the display device.

Exemplarily, the first initialization voltage line Vinit1 is configured to write the first initialization voltage.

Figure 8:
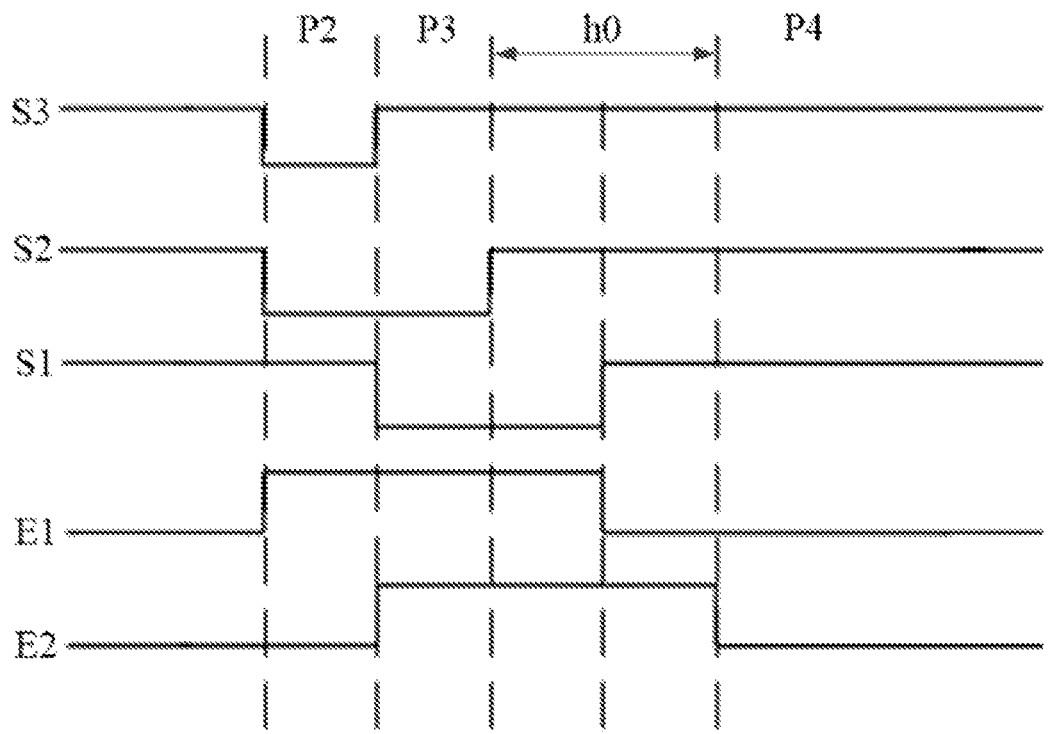
FIG. 8 is a first driving timing diagram of a pixel circuit according to an embodiment of the present disclosure.

As shown in FIG. 8, exemplarily, in the bias voltage compensation phase P2, the first initialization circuit 14 controls to connect the first initialization voltage line Vinit1 and the connection node N0 under the control of the second scan signal: the third initialization circuit 15 controls to connect the control end of the driving circuit 11 and the connection node N0 under the control of the second light-emitting control signal, and resets the control end of the driving circuit 11.

As shown in FIG. 8, exemplarily, in the bias voltage compensation phase P2, the compensation control circuit 13 controls to connect the control end of the driving circuit 11 and the first end of the driving circuit 11 under the control of the second scan signal, to realize the reset of the first end of the driving circuit 11.

Exemplarily, in the writing-in compensation phase P3, the compensation control circuit 13 controls to connect the control end of the driving circuit 11 and the first end of the driving circuit 11 under the control of the second scan signal provided by the second scan line S2, the data writing-in circuit 41 controls to connect the data line D1 and the second end of the driving circuit 11 under the control of the first scan signal, and writes the data signal to the second end of the driving circuit 11, so as to realize the threshold voltage compensation of the driving circuit 11. After the writing-in compensation phase P3, the potential of the control end (e.g., the gate electrode of the driving transistor) of the driving circuit 11 becomes Vdata+Vth, wherein Vdata is the data voltage corresponding to the data signal, and Vth is the threshold voltage of the driving transistor included in the driving circuit 11.

Exemplarily, in the writing-in compensation phase P3, the third initialization circuit 15 controls to disconnect the control end of the driving circuit 11 from the connection node N0 under the control of the second light-emitting control signal.

In the pixel circuit provided by the above embodiment, the compensation control circuit 13 and the first initialization circuit are both coupled to the second scan line S2, which can reduce the number of signal lines laid out in the display device and reduce the difficulty of the layout of the gate driving circuit 11, which is beneficial to the narrowing of the frame of the display device.

At the same time, the pixel circuit includes the third initialization circuit 15, which can disconnect the first initialization voltage line Vinit1 from the control end of the driving circuit 11 during the writing-in compensation period P3, so as to ensure that a normal threshold compensation function can be implemented for the driving circuit 11 in the writing-in compensation period P3.

Figure 5:
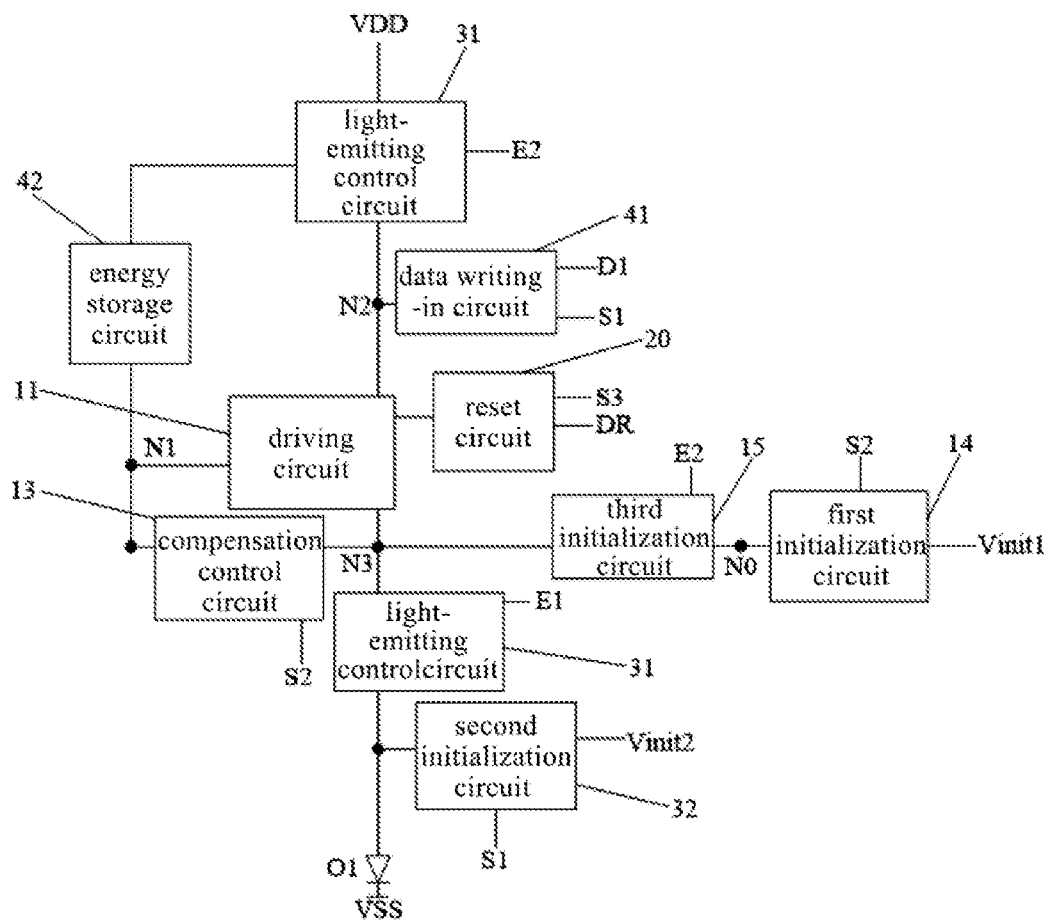
FIG. 5 is a schematic diagram of a third structure of a pixel circuit according to an embodiment of the present disclosure.
Figure 6:
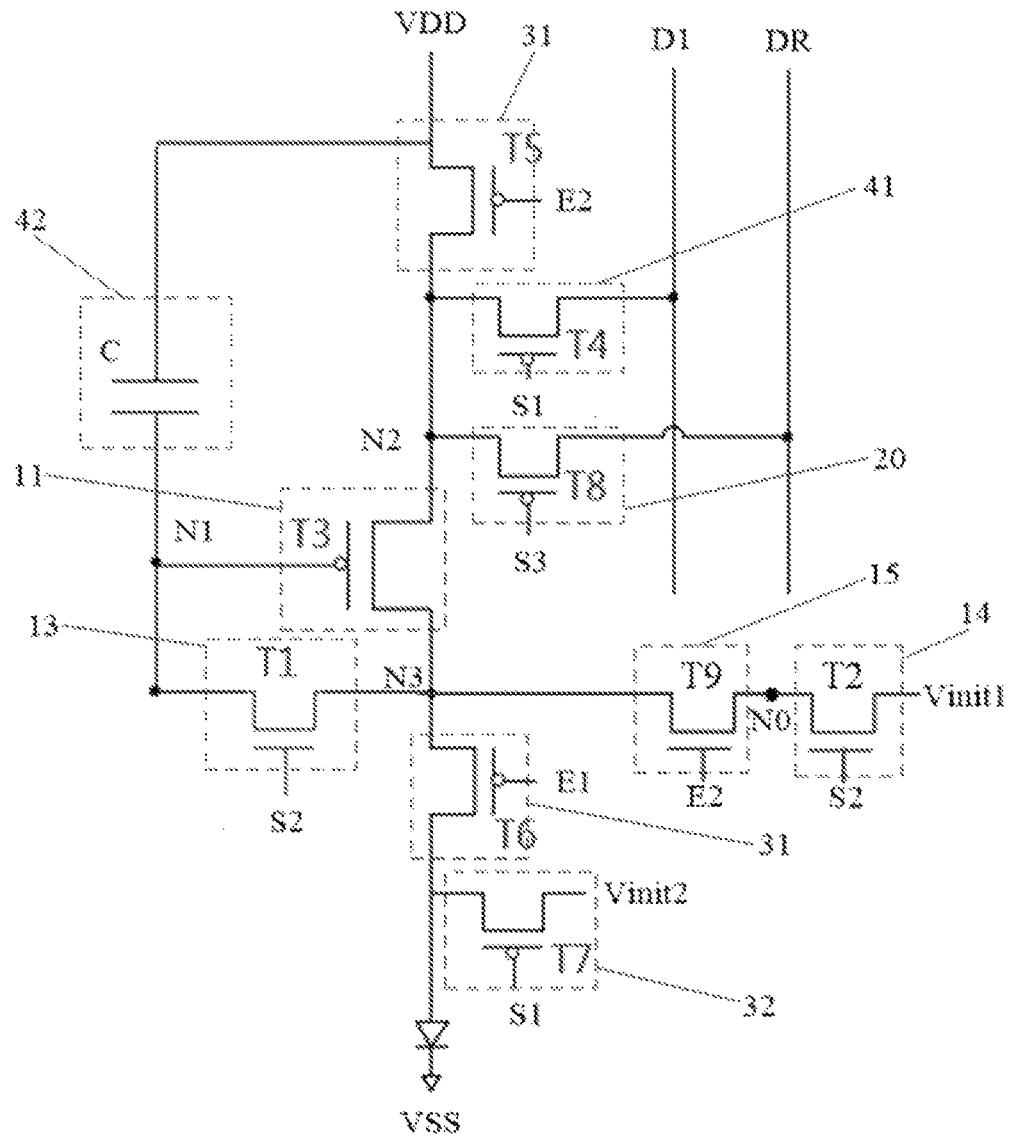
FIG. 6 is a schematic diagram of a first circuit corresponding to FIG. 5.
Figure 7:
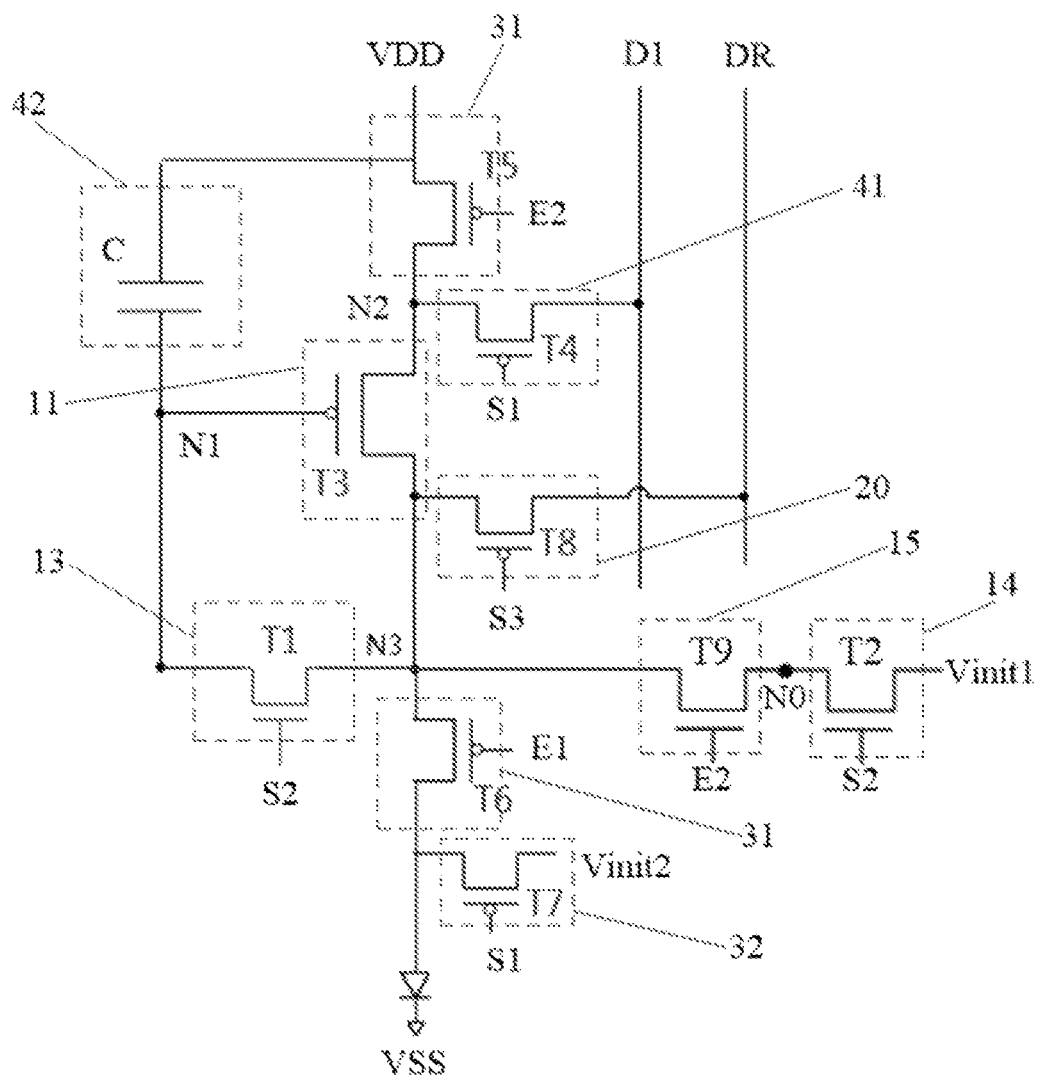
FIG. 7 is a schematic diagram of a second circuit corresponding to FIG. 5.

As shown in FIG. 5, in some embodiments, the pixel circuit further includes: a compensation control circuit 13, a first initialization circuit 14 and a third initialization circuit 15:

The compensation control circuit 13 is electrically connected to the second scan line S2, the control end of the driving circuit 11 and the first end of the driving circuit 11, respectively, is configured to control to connect the control end of the driving circuit 11 and the first end of the driving circuit 11 under the control of the second scan signal provided by the second scan line S2:

The first initialization circuit 14 is respectively coupled to the second scan line S2, the first initialization voltage line Vinit1 and the connection node N0, and is configured to control to connect the first initialization voltage line Vinit1 and the connection node N0 under the control of the second scan signal:

The third initialization circuit 15 is respectively coupled to the second light-emitting control line E2, and the first end of the driving circuit 11 and the connection node N0, and is configured to connect the first end of the driving circuit 11 and the connection node N0 under the control of the second light-emitting control signal provided by the second light-emitting control line E2.

As shown in FIG. 8, exemplarily, in the bias voltage compensation phase P2, the first initialization circuit 14 controls to connect the first initialization voltage line Vinit1 and the connection node N0 under the control of the second scan signal; the third initialization circuit 15 controls to connect the first end of the driving circuit 11 and the connection node N0 under the control of the second light-emitting control signal, and resets the first end of the driving circuit 11. Exemplarily, in the bias voltage compensation phase P2, the compensation control circuit 13 controls to connect the control end of the driving circuit 11 and the first end of the driving circuit 11 under the control of the second scan signal, to reset the control end of the driving circuit 11.

Exemplarily, in the writing-in compensation phase P3, the third initialization circuit 15 controls to disconnect the first end of the driving circuit 11 from the connection node N0 under the control of the second light-emitting control signal.

In the pixel circuit provided in the above-mentioned embodiment, the compensation control circuit 13 and the first initialization circuit 14 are set to be coupled to the second scan line S2, which can reduce the number of signal lines laid out in the display device and reduce the difficulty of the layout of the gate driving circuit 11, which is beneficial to the narrowing of the frame of the display device.

At the same time, the pixel circuit includes the third initialization circuit 15, which can disconnect the first initialization voltage line Vinit1 from the first end of the driving circuit 11 during the writing-in compensation period P3, so as to ensure that a normal threshold compensation function is implemented for the driving circuit 11 in the writing-in compensation period.

In addition, the third initialization circuit 15 is coupled to the second light-emitting control line E2, and the first end of the driving circuit 11 and the connection node N0, which reduces the leakage path of the first node N1, which is beneficial to protect the potential of the first node N1 at low frequencies.

Figure 2:
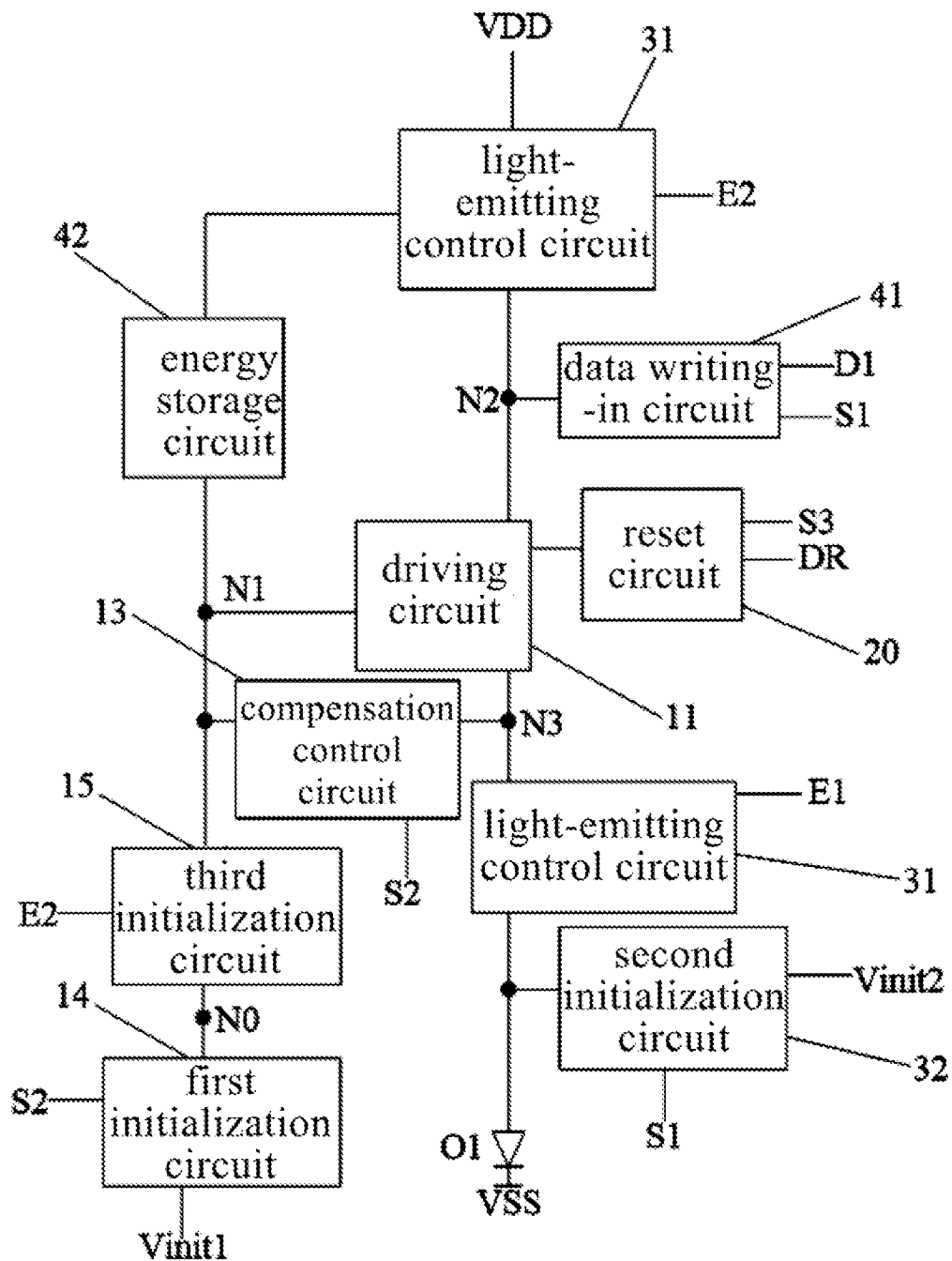
FIG. 2 is a schematic diagram of a second structure of a pixel circuit according to an embodiment of the present disclosure.

As shown in FIG. 2, in some embodiments, the pixel circuit further includes: a compensation control circuit 13, a first initialization circuit 14 and a third initialization circuit 15:

The compensation control circuit 13 is respectively electrically connected to the second scan line S2, the control end (i.e. the first node N1) of the driving circuit 11 and the first end (i.e. the third node N3) of the driving circuit 11, is configured to connect the control end of the driving circuit 11 and the first end of the driving circuit 11 under the control of the second scan signal provided by the second scan line S2:

The first initialization circuit 14 is respectively coupled to the second scan line S2, the first initialization voltage line Vinit1 and the connection node N0, and is configured to control to connect the first initialization voltage line Vinit1 and the connection node N0 under the control of the second scan signal:

The third initialization circuit 15 is respectively coupled to the second light-emitting control line E2, the control end of the driving circuit 11 and the connection node N0, and is configured to control to connect the control end of the driving circuit 11 and the connection node N0 under the control of the second light-emitting control signal provided by the second light-emitting control line E2.

Figure 9:
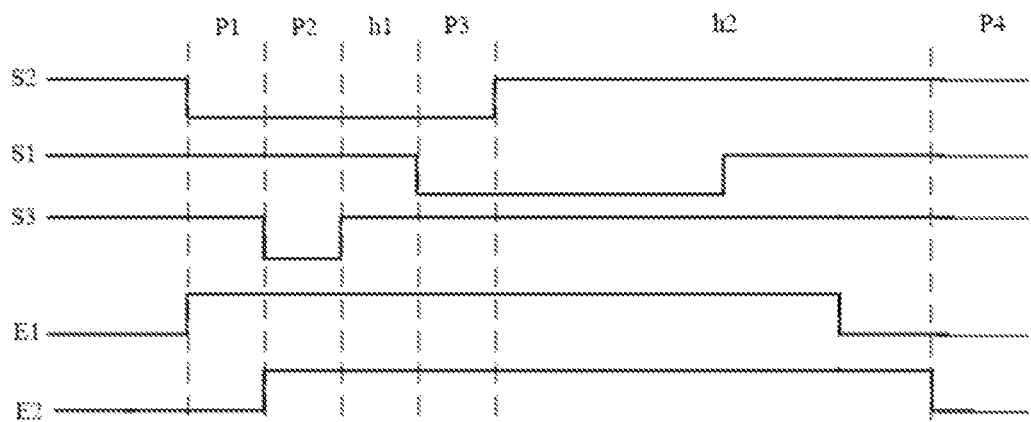
FIG. 9 is a second driving timing diagram of the pixel circuit according to an embodiment of the present disclosure.

As shown in FIG. 9, exemplarily, in the initialization phase P1 before the bias voltage compensation phase P2: the first initialization circuit 14 controls to connect the first initialization voltage line Vinit1 and the connection node N0 under the control of the second scan signal, the third initialization circuit 15 controls to connect the control end of the driving circuit 11 and the connection node N0 under the control of the second light-emitting control signal, to realize the reset of the control end of the driving circuit 11: the compensation control circuit 13 controls to connect the control end of the driving circuit 11 and the first end of the driving circuit 11 under the control of the second scan signal, to realize the reset of the first end of the driving circuit 11. In the bias voltage compensation phase P2: the first initialization circuit 14 controls to connect the first initialization voltage line Vinit1 and the connection node N0 under the control of the second scan signal; the third initialization circuit 15 controls to disconnect the control end of the driving circuit 11 from to the connection node N0 under the control of the second light-emitting control signal: the compensation control circuit 13 controls to connect the control end of the driving circuit 11 and the first end of the driving circuit 11 under the control of the second scan signal.

In the pixel circuit provided by the above embodiment, the compensation control circuit 13 and the first initialization circuit are both coupled to the second scan line S2, which can reduce the number of signal lines laid out in the display device and reduce the difficulty of the layout of the gate driving circuit 11, which is beneficial to the narrowing of the frame of the display device.

At the same time, the pixel circuit includes the third initialization circuit 15, which can disconnect the first initialization voltage line Vinit1 from the control end of the driving circuit 11 during the writing-in compensation period P3, so as to ensure that a normal threshold compensation function is implemented for the driving circuit 11 in the writing-in compensation period P3.

As shown in FIG. 5, in some embodiments, the pixel circuit further includes: a compensation control circuit 13, a first initialization circuit 14 and a third initialization circuit 15:

The compensation control circuit 13 is electrically connected to the second scan line S2, the control end of the driving circuit 11 and the first end of the driving circuit 11, respectively, is configured to control to connect the control end of the driving circuit 11 and the first end of the driving circuit 11 under the control of the second scan line signal provided in the second scan line S2.

The first initialization circuit 14 is respectively coupled to the second scan line S2, the first initialization voltage line Vinit1 and the connection node N0, and is configured to control to connect first initialization voltage line Vinit1 and the connection node N0 under the control of the second scan signal:

The third initialization circuit 15 is respectively coupled to the second light-emitting control line E2, and the first end of the driving circuit 11 and the connection node N0, and is configured to control to connect the first end of the driving circuit 11 and the connection node N0 under the control of the second light-emitting control signal provided by the second light-emitting control line E2.

As shown in FIG. 9, exemplarily, in the initialization phase P1 before the bias voltage compensation phase P2: the first initialization circuit 14 controls to connect the first initialization voltage line Vinit1 and the connection node N0 under the control of the second scan signal, the third initialization circuit 15 controls to connect the first end of the driving circuit 11 and the connection node N0 under the control of the second light-emitting control signal, so as to realize the reset of the first end of the driving circuit 1. The compensation control circuit 13 controls to connect the control end of the driving circuit 11 and the first end of the driving circuit 11 under the control of the second scan signal, to realize the reset of the control end of the driving circuit 11. In the bias voltage compensation phase P2: the first initialization circuit 14 controls to connect the first initialization voltage line Vinit1 and the connection node N0 under the control of the second scan signal, the third initialization circuit 15 controls to disconnect the first end of the driving circuit 11 from the connection node N0 under the second light-emitting control signal: the compensation control circuit 13 controls to connect the control end of the driving circuit 11 and the first end of the driving circuit 11 under the control of the second scan signal.

In the pixel circuit provided by the above embodiment, the compensation control circuit 13 and the first initialization circuit are both coupled to the second scan line S2, which can reduce the number of signal lines laid out in the display device and reduce the difficulty of the layout of the gate driving circuit 11, which is beneficial to the narrowing of the frame of the display device.

At the same time, the pixel circuit includes the third initialization circuit 15, which can disconnect the first initialization voltage line Vinit1 from the first end of the driving circuit 11 during the writing-in compensation period P3, so as to ensure that a normal threshold compensation function is implemented for the driving circuit 11 in the writing-in compensation period.

As shown in FIG. 2 and FIG. 5, in some embodiments, the pixel circuit further includes: a light-emitting control circuit 31, an energy storage circuit 42 and a light-emitting element O1:

The light-emitting control circuit 31 is respectively coupled to the first light-emitting control line E1, the first end of the driving circuit 11 and the light-emitting element O1, and is configured to control to connect the first end of the driving circuit 11 and the light-emitting element O1 under the control of the first light-emitting control signal provided by the first light-emitting control line E1;

The energy storage circuit 42 is respectively coupled to the control end of the driving circuit 11 and the first voltage line.

As shown in FIG. 2 and FIG. 5, in some embodiments, the light-emitting control circuit 31 is further coupled to the second light-emitting control line E2, the first voltage line and the second end of the driving circuit 11, respectively, is configured to control to connect the first voltage line and the second end of the driving circuit 11 under the control of the second light-emitting control signal provided by the second light-emitting control line E2.

Exemplarily, the first voltage line includes a positive power line capable of transmitting a positive power signal VDD. Whether the first voltage provided by the first voltage line is written into the second end of the driving circuit 11 is controlled by the light-emitting control signal.

As shown in FIG. 8, exemplarily, in the bias voltage compensation phase P2, the light-emitting control circuit 31 controls to connect the first voltage line and the second terminal of the driving circuit 11 under the control of the second light-emitting control signal, so as to realize the reset of the second end of the driving circuit 11.

As shown in FIG. 9, exemplarily, an initialization phase P1 is further included before the bias voltage compensation phase P2. In the initialization phase P1, the light-emitting control circuit 31 controls to connect the first voltage line and the second end of the driving circuit 11 under the control of the second light-emitting control signal, to realize the reset of the second end of the driving circuit 11. In the bias voltage compensation phase P2, the light-emitting control circuit 31 controls to disconnect the first voltage line and the second end of the driving circuit 11 under the control of the second light-emitting control signal.

As shown in FIG. 8 and FIG. 9, exemplarily, in the light-emitting phase P4, the light-emitting control circuit 31 controls to connect the first voltage line and the second end of the driving circuit 11 under the control of the second light-emitting control signal line, the light-emitting control circuit 31 also controls to connect the first end of the driving circuit 11 and the light-emitting element O1 under the control of the first light-emitting control signal provided by the first light-emitting control line E1.

As shown in FIG. 2 and FIG. 5, in some embodiments, the pixel circuit further includes: a second initialization circuit 32:

The second initialization circuit 32 is respectively coupled to the first scan line S1, the second initialization voltage line Vinit2 and the light-emitting element O1, and is used to control to connect the second initialization voltage line Vinit2 and the light-emitting element O1 under the control of the first scan signal.

Exemplarily, the second initialization voltage line Vinit2 is used to provide a second initialization voltage.

The second initialization circuit 32 can reset the first electrode of the light-emitting element O1 under the control of the second scan signal.

It should be noted that the first electrode of the light-emitting element O1 includes an anode, and the second electrode (i.e., the cathode) of the light-emitting element O1 receives a negative power supply signal VSS.

As shown in FIG. 3, FIG. 4, FIG. 6 and FIG. 7, in some embodiments, the compensation control circuit 13 includes a first transistor T1, the first initialization circuit 14 includes a second transistor T2, and the driving circuit 11 includes a third transistor T3 (i.e., a driving transistor), the third initialization circuit 15 includes a ninth transistor T9: a gate electrode of the first transistor T1 is coupled to the second scan line S2, and a first electrode of the first transistor T1 is coupled to a second electrode of the third transistor T3, a second electrode of the first transistor T1 is coupled to a gate electrode of the third transistor T3: a gate electrode of the second transistor T2 is coupled to the second scan line S2, a first electrode of the second transistor T2 is coupled to the first initialization voltage line Vinit1, and a second electrode of the second transistor T2 is coupled to the connection node N0; a gate electrode of the ninth transistor T9 is coupled to the second light-emitting control line E2, a first electrode of the ninth transistor T9 is coupled to the connection node N0, and a second electrode of the ninth transistor T9 is coupled to a gate electrode of the third transistor T3:

The data writing-in circuit 41 includes a fourth transistor T4, the reset circuit 20 includes an eighth transistor T8; a gate electrode of the fourth transistor T4 is coupled to the first scan line S1, and a first electrode of the fourth transistor T4 is coupled to the data line D1, a second electrode of the fourth transistor T4 is coupled to a first electrode of the third transistor T3, and a gate electrode of the eighth transistor T8 is connected to the third scan line S3, a first electrode of the eighth transistor T8 is coupled to the reset voltage line DR, a second electrode of the eighth transistor T8 is coupled to a first electrode of the third transistor T3 or a second electrodes of the third transistor T3;

The light-emitting control circuit 31 includes a fifth transistor T5 and a sixth transistor T6; a gate electrode of the fifth transistor T5 is coupled to the second light-emitting control line E2, and a first electrode of the fifth transistor T5 is coupled to the first voltage line, a second electrode of the fifth transistor T5 is coupled to a first electrode of the third transistor T3, and a gate electrode of the sixth transistor T6 is coupled to the first light-emitting control line E1, a first electrode of the sixth transistor T6 is coupled to a second electrode of the third transistor T3, and a second electrode of the sixth transistor T6 is coupled to the light-emitting element O1:

The energy storage circuit includes a storage capacitor C, a first electrode plate of the storage capacitor C is coupled to the first voltage line, and a second electrode plate of the storage capacitor C is coupled to the gate electrode of the third transistor.

The second initialization circuit 32 includes a seventh transistor T7, a gate electrode of the seventh transistor T7 is coupled to the first scan line S1, and a first electrode of the seventh transistor T7 is coupled to the second initialization voltage line Vinit2, and a second electrode of the seventh transistor T7 is coupled to the light-emitting element O1.

As shown in FIG. 8, exemplarily, each display period of the pixel circuit sequentially includes: a bias voltage compensation phase P2, a writing-in compensation phase P3, a buffer phase h0 and a light-emitting phase P4.

In the bias voltage compensation phase P2, T1, T2, T5, T8 and T9 are turned on, and N1, N2 and N3 are reset. T3 is turned on and a current passing through T3, thereby eliminating the influence of the previous frame on T3, T4, T6 and T7 are turned off.

In the writing-in compensation phase P3, T1, T2, T4 and T7 are turned on, and T5, T6, T8 and T9 are turned off, so as to realize the threshold voltage compensation of T3 and reset the anode of the light-emitting element O1.

In the buffer phase h0, T1, T2, T5, T8, and T9 are turned off, T4 and T7 are changed from on to off, T6 is changed from off to on, and the potential of the N1 is maintained at a voltage after the writing-in compensation period.

In the light-emitting phase P4, T3, T5, T6 and T9 are turned on, T1, T2, T4, T7 and T8 are turned off, and the light-emitting element O1 emits light.

As shown in FIG. 9, exemplarily, each display period of the pixel circuit sequentially includes: an initialization phase P1, a bias voltage compensation phase P2, a first buffer phase h1, a writing-in compensation phase P3, a second buffer phase h2 and a light-emitting phase P4.

In the initialization phase P1, T1, T2, T5 and T9 are turned on to reset N1, N2 and N3. T3 is turned on and a current pass through T3, thereby eliminating the influence of the previous frame on T3, T4, T6, T7 and T8 are turned off.

In the bias voltage compensation phase P2, T1, T2 and T8 are turned on to reset N2, or reset N1 and N3, T4, T5, T6, T7 and T9 are turned off.

In the first buffer phase h1, T1 and T2 are turned on, and T4, T5, T6, T7, T8 and T9 are turned off.

In the writing-in compensation phase P3, T1, T2, T4 and T7 are turned on, and T5, T6, T8 and T9 are turned off, so as to realize the threshold voltage compensation of T3 and reset the anode of the light-emitting element O1.

In the second buffer phase h2, T1, T2, T5, T8 and T9 are turned off, T4 and T7 are changed from on to off, T6 is changed from off to on, and the potential of the N1 point is maintained at a voltage after the writing-in compensation period.

In the light-emitting phase P4, T3, T5, T6 and T9 are turned on, T1, T2, T4, T7 and T8 are turned off, and the light-emitting element O1 emits light.

As shown in FIG. 3, FIG. 4, FIG. 6 and FIG. 7, in some embodiments, the compensation control circuit 13 includes a first transistor T1, the first initialization circuit 14 includes a second transistor T2, and the driving circuit 11 includes a third transistor T3, the third initialization circuit 15 includes a ninth transistor T9: the gate electrode of the first transistor T1 is coupled to the second scan line S2, and the first electrode of the first transistor T1 is coupled to the second electrode of the third transistor T3, the second electrode of the first transistor T1 is coupled to the gate electrode of the third transistor T3: the gate electrode of the second transistor T2 is coupled to the second scan lines S2, the first electrode of the second transistor T2 is coupled to the first initialization voltage line Vinit1, and the second electrode of the second transistor T2 is coupled to the connection node N0; the gate electrode of the ninth transistor T9 is coupled to the second light-emitting control line E2, the first electrode of the ninth transistor T9 is coupled to the connection node N0, and the second electrode of the ninth transistor T9 is coupled to the second electrode of the third transistor T3:

The data writing-in circuit 41 includes a fourth transistor T4, the reset circuit 20 includes an eighth transistor T8: the gate electrode of the fourth transistor T4 is coupled to the first scan line S1, and the first electrode of the fourth transistor T4 is coupled to the data line D1, the second electrode of the fourth transistor T4 is coupled to the first electrode of the third transistor T3, and the gate electrode of the eighth transistor T8 is coupled to the third scan line S3, the first electrode of the eighth transistor T8 is coupled to the reset voltage line DR, the second electrode of the eighth transistor T8 is coupled to the first electrode of the third transistor T3 or the second electrodes of the third transistor T3:

The light-emitting control circuit 31 includes a fifth transistor T5 and a sixth transistor T6; the gate electrode of the fifth transistor T5 is coupled to the second light-emitting control line E2, and the first electrode of the fifth transistor T5 is connected to the first voltage line, the second electrode of the fifth transistor T5 is coupled to the first electrode of the third transistor T3, and the gate electrode of the sixth transistor T6 is coupled to the first light-emitting control line E1, the first electrode of the sixth transistor T6 is coupled to the second electrode of the third transistor T3, and the second electrode of the sixth transistor T6 is coupled to the light-emitting element O1:

The second initialization circuit 32 includes a seventh transistor T7, the gate electrode of the seventh transistor T7 is coupled to the first scan line S1, and the first electrode of the seventh transistor T7 is coupled to the second initialization voltage line Vinit2, and the second electrode of the seventh transistor T7 is coupled to the light-emitting element O1:

The energy storage circuit includes a storage capacitor C, the first plate electrode of the storage capacitor C is coupled to the first voltage line, and the second electrode plate of the storage capacitor C is coupled to the gate electrode of the third transistor.

As shown in FIG. 8, exemplarily, each display period of the pixel circuit sequentially includes: a bias voltage compensation phase P2, a writing-in compensation phase P3, a buffer phase and a light-emitting phase P4.

In the bias voltage compensation phase P2, T1, T2, T5, T8 and T9 are turned on, and N1, N2 and N3 are reset. T3 is turned on and a current passes through T3, thereby eliminating the influence of the previous frame on T3. T4, T6 and T7 are turned off.

In the writing-in compensation phase P3, T1, T2, T4 and T7 are turned on, and T5, T6, T8 and T9 are turned off, so as to realize the threshold voltage compensation of T3 and reset the anode of the light-emitting element O1.

In the buffering phase, T1, T2, T5, T8 and T9 are turned off, T4 and T7 are changed from on to off, T6 is changed from off to on, and the potential of the N1 point is maintained at the voltage after the writing-in compensation period.

In the light-emitting phase P4, T3, T5, T6 and T9 are turned on, T1, T2, T4, T7 and T8 are turned off, and the light-emitting element O1 emits light.

As shown in FIG. 9, exemplarily, each display period of the pixel circuit sequentially includes: an initialization phase P1, a bias voltage compensation phase P2, a first buffer phase h1, a writing-in compensation phase P3, and a second buffer phase h2 and a light-emitting phase P4.

In the initialization phase P1, T1, T2, T5 and T9 are turned on to reset N1, N2 and N3. T3 is turned on and the current passes through T3, thereby eliminating the influence of the previous frame on T3. T4, T6, T7 and T8 are turned off.

In the bias voltage compensation phase P2, T1, T2 and T8 are turned on to reset N2, or reset N1 and N3, T4, T5, T6, T7 and T9 are turned off.

In the first buffer phase h1, T1 and T2 are turned on, and T4, T5, T6, T7, T8 and T9 are turned off.

In the writing-in compensation phase P3, T1, T2, T4 and T7 are turned on, and T5, T6, T8 and T9 are turned off, so as to realize the threshold voltage compensation of T3 and reset the anode of the light-emitting element O1.

In the second buffer phase h2, T1, T2, T5, T8 and T9 are turned off, T4 and T7 are changed from on to off, T6 is changed from off to on, and the potential of the N1 point is maintained at the compensated voltage after the writing-in compensation period.

In the light-emitting phase P4, T3, T5, T6 and T9 are turned on, T1, T2, T4, T7 and T8 are turned off, and the light-emitting element O1 emits light.

Exemplarily, as shown in FIG. 2, N1 is the first node, and the first node N1 is electrically connected to the gate electrode of T3: N2 is the second node, and N3 is the third node: N2 is electrically connected to the source electrode of T3, and N3 is electrically connected to the drain electrode of T3.

Exemplarily, in at least one embodiment of the pixel circuit, T1, T2, T3, T4, T5, T6, T7 and T8 may all be low temperature polysilicon thin film transistors, T1, T2, T3, T4, T5, T6, T7 and T8 may all be p-type transistors, but not limited thereto.

Exemplarily, T1 and T2 may be single-gate transistors or dual-gate transistors.

By adding T8 to provide a bias voltage for the first electrode or the second electrode of T3, it is beneficial to improve the stability of T3: by setting T7 to initialize the potential of the anode of O1, it is beneficial to the freedom degree of switching frequency under low frequency flickering.

As shown in FIG. 2, FIG. 5, FIG. 8 and FIG. 9, an embodiment of the present disclosure further provides a driving method, which is applied to the pixel circuit provided by the above-mentioned embodiment, and the display period includes a bias voltage compensation phase P2 and a writing-in compensation phase P3, the driving method includes:

In the bias voltage compensation phase P2, controlling, by the reset circuit 20, to connect the reset voltage line DR and the second end of the driving circuit 11 under the control of the third scan signal; or control to connect the reset voltage line DR and the first end of the driving circuit 11 under the control of the third scan signal, so as to write the reset voltage to the first end or the second end of the driving circuit 11;

In the writing-in compensation phase P3, controlling, by the data writing-in circuit 41, to connect data line D1 and the second end of the driving circuit 11 under the control of the first scan signal, and write the data signal to the second end of the driving circuit 11.

When the pixel circuit is driven by the driving method provided by the embodiment of the present disclosure, a reset voltage can be applied to the first end or the second end of the driving circuit 11 in the bias voltage compensation phase P2, so that before the data signal is written, the first end or the second end of the driving circuit is reset to eliminate the influence of the previous frame of image on the driving circuit 11, and to ensure that the state of the driving circuit is the same when the next frame of image is written: so that the compensation driving circuit 11 works at a certain bias voltage for a period of time, the characteristics thereof are shifted to improve short-term afterimages and slow response times. In addition, when driving at low frequency, the difference in brightness caused by the characteristic shift of the driving circuit 11 in the long-term light-emitting phase can be compensated, the Flicker phenomenon of the screen can be improved, the screen quality can be optimized, and the user experience can be improved. In addition, when the pixel circuit provided by the embodiment of the present disclosure is applied to a display device, the driving method provided by the embodiment of the present disclosure is used to drive the pixel circuit, so that the specific bias voltage compensation is implemented on the driving circuit 11 in each pixel circuit in the display device, the compensation effect is good.

In addition, since the reset voltage provided by the reset voltage line DR can be adjusted independently, an appropriate bias voltage can be provided to each pixel circuit in the display device as required.

In some embodiments, in the bias voltage compensation phase P2, the first initialization circuit 14 controls to connect the first initialization voltage line Vinit1 and the connection node N0 under the control of the second scan signal: the third initialization circuit 15 controls to connect the control end of the driving circuit 11 and the connection node N0 under the control of the second light-emitting control signal: the light-emitting control circuit 31 controls to connect the first voltage line and the second end of the driving circuit 11 under the control of the second light-emitting control signal: the compensation control circuit 13 controls to connect the control end of the driving circuit 11 and the first end of the driving circuit 11 under the control of the second scan signal.

Exemplarily, in the bias voltage compensation phase P2, the first initialization circuit 14 controls to connect the first initialization voltage line Vinit1 and the connection node N0 under the control of the second scan signal: the third initialization circuit 15 controls to connect the control end of the driving circuit 11 and the connection node N0 under the control of the second light-emitting control signal: so as to reset the control end of the driving circuit 11. Under the control of the second scan signal, the compensation control circuit 13 controls to connect the control end of the driving circuit 11 and the first end of the driving circuit 11 to reset the first end of the driving circuit 11.

In some embodiments, in the bias voltage compensation phase P2, the first initialization circuit 14 controls to connect the first initialization voltage line Vinit1 and the connection node N0 under the control of the second scan signal: the third initialization circuit 15 controls to connect the first end of the driving circuit 11 and the connection node N0 under the control of the second light-emitting control signal: the light-emitting control circuit 31 control to connect the first voltage line and the second end of the driving circuit 11 under the control of the second light-emitting control signal: the compensation control circuit 13 controls to connect the control end of the driving circuit 11 and the first end of the driving circuit 11 under the control of the second scan signal.

Exemplarily, in the bias voltage compensation phase P2, the first initialization circuit 14 controls to connect the first initialization voltage line Vinit1 and the connection node N0 under the control of the second scan signal: the third initialization circuit 15 controls to connect the first end of the driving circuit 11 and the connection node N0 under the control of the second light-emitting control signal, so as to reset the control end of the driving circuit 11. Under the control of the second scan signal, the compensation control circuit 13 controls to connect the control end of the driving circuit 11 and the first end of the driving circuit 11 to reset the first end of the driving circuit 11.

In some embodiments, the display period further includes an initialization phase P1 before the bias voltage compensation phase P2; the driving method further includes:

In the initialization phase P1, controlling, by the first initialization circuit 14, to connect the first initialization voltage line Vinit1 and the connection node N0 under the control of the second scan signal; controlling, by the third initialization circuit 15, to connect the first end of the driving circuit 11 and the connection node N0 under the control of the second light-emitting control signal; controlling, by the light-emitting control circuit 31, to connect the first voltage line and the second end of the driving circuit 11 under the control of the second light-emitting control signal: controlling, by the compensation control circuit 13, to connect the control end of the driving circuit 11 and the first end of the driving circuit 11 under the control of the second scan signal.

In the initialization phase P1, controlling, by the first initialization circuit 14, to connect the first initialization voltage line Vinit1 and the connection node N0 under the control of the second scan signal; controlling, by the third initialization circuit 15, to connect the first end of the driving circuit 11 and the connection node N0 under the control of the second light-emitting control signal, to reset the first end of the driving circuit 11: controlling, by the compensation control circuit 13, to connect the control end of the driving circuit 11 and the first end of the driving circuit 11 under the control of the second scan signal, so as to reset the control end of the driving circuit 11. In the bias voltage compensation phase P2: controlling, by the first initialization circuit 14, to connect the first initialization voltage line Vinit1 and the connection node N0 under the control of the second scan signal; controlling, by the third initialization circuit 15, to disconnect the first end of the driving circuit and the connection node N0 under the control of the second light-emitting control signal: controlling, by the compensation control circuit 13, to connect the control end of the driving circuit 11 and the first end of the driving circuit under the control of the second scan signal.

In some embodiments, the display period further includes an initialization phase P1 before the bias voltage compensation phase P2: the driving method further includes:

In the initialization phase P1, controlling, by the first initialization circuit 14, to connect the first initialization voltage line Vinit1 and the connection node N0 under the control of the second scan signal; controlling, by the third initialization circuit 15, to connect the first end of the driving circuit 11 and the connection node N0 under the control of the second light-emitting control signal; controlling, by the light-emitting control circuit 31, to connect the first voltage line and the second end of the driving circuit 11 under the control of the second light-emitting control signal: controlling, by the compensation control circuit 13, to connect the control end of the driving circuit 11 and the first end of the driving circuit 11 under the control of the second scan signal.

In the initialization phase P1, controlling, by the first initialization circuit 14, to connect the first initialization voltage line Vinit1 and the connection node N0 under the control of the second scan signal; controlling, by the third initialization circuit 15, to connect the control end of the driving circuit 11 and the connection node N0 under the control of the second light-emitting control signal, to reset the control end of the driving circuit 11: controlling, by the compensation control circuit 13, to connect the control end of the driving circuit 11 and the first end of the driving circuit 11 under the control of the second light-emitting control signal, to reset the first end of the driving circuit 11. In the bias voltage compensation phase P2: controlling, the first initialization circuit 14, to connect the first initialization voltage line Vinit1 and the connection node N0 under the control of the second scan signal: controlling, by the third initialization circuit 15, to disconnect the control end of the driving circuit and the connection node N0 under the control of the second light-emitting control signal: controlling, by the compensation control circuit 13, to connect the control end of the driving circuit 11 and the first end of the driving circuit 11 under the second scan signal.

In some embodiments, the display period further includes a light-emitting phase P4 after the writing-in compensation phase P3: the driving method further includes:

In the light-emitting phase P4, controlling, by the light-emitting control circuit 31, to connect the first voltage line and the second end of the driving circuit 11 under the control of the second light-emitting control signal, and to connect the first end of the driving circuit 11 and the light-emitting element O1 under the control of the first light-emitting control signal, and driving, by the driving circuit 11, the light-emitting element O1 to emit light.

Embodiments of the present disclosure further provide a display device including the pixel circuit provided by the above embodiments.

Because in the pixel circuit provided by the above embodiment, by setting the reset circuit 20, a reset voltage can be applied to the first end or the second end of the driving circuit 11 in the bias voltage compensation phase P2, so that before the data signal is written, the first end or the second end of the driving circuit is reset to eliminate the influence of the previous frame of image on the driving circuit 11, and to ensure that the state of the driving circuit is the same when the next frame of image is written: so that the compensation driving circuit 11 works at a certain bias voltage for a period of time, the characteristics thereof are shifted to improve short-term afterimages and slow response times. In addition, when driving at low frequency, the difference in brightness caused by the characteristic shift of the driving circuit 11 in the long-term light-emitting phase can be compensated, the Flicker phenomenon of the screen can be improved, the screen quality can be optimized, and the user experience can be improved. In addition, when the pixel circuit provided by the embodiment of the present disclosure is applied to a display device, the driving method provided by the embodiment of the present disclosure is used to drive the pixel circuit, so that the specific bias voltage compensation is implemented on the driving circuit 11 in each pixel circuit in the display device, the compensation effect is good. In addition, when the pixel circuits provided in the above embodiments are applied to the display substrate, specific bias voltage compensation can be implemented for the driving circuit 11 in each pixel circuit in the display substrate, which has a good compensation effect. In addition, since the reset voltage provided by the reset voltage line DR can be adjusted independently, an appropriate bias voltage can be provided to each pixel circuit in the display substrate as required.

Therefore, when the display device provided by the embodiment of the present disclosure includes the above-mentioned pixel circuit, it also has the above-mentioned beneficial effects, which will not be repeated here.

It should be noted that the display device can be any product or component with a display function, such as a TV, a monitor, a digital photo frame, a mobile phone, a tablet computer, etc., wherein the display device also includes a flexible circuit board, a printed circuit board, a back plate and so on.

It should be noted that the "same layer" in the embodiments of the present disclosure may refer to a film layer on the same structural layer. Or, for example, the film layers in the same layer may be a layer structure formed by using the same film forming process to form a film layer for forming a specific pattern, and then using the same mask to pattern the film layer through one patterning process. Depending on the specific pattern, one patterning process may include multiple exposure, development or etching processes, and the specific patterns in the formed layer structure may be continuous or discontinuous. These specific patterns may also be at different heights or have different thicknesses.

In the method embodiments of the present disclosure, the sequence numbers of the steps are not used to limit the sequence of the steps. For those of ordinary skill in the art, the sequence of the steps can be changed without any creative effort, which is also within the scope of protection of the present disclosure.

It should be noted that each embodiment in the present disclosure is described in a progressive manner, and the same and similar parts between the various embodiments may be referred to each other, and each embodiment focuses on the differences from other embodiments. In particular, as for the method embodiment, since it is basically similar to the product embodiment, the description is relatively simple, and the relevant part can be referred to the part of the description of the product embodiment.

Unless otherwise defined, technical or scientific terms used in the present disclosure shall have the ordinary meaning as understood by one of ordinary skill in the art to which this disclosure belongs. As used in the present disclosure, "first," "second," and similar terms do not denote any order, quantity, or importance, but are merely used to distinguish various components. "Including" or "comprising" and similar words mean that the elements or things appearing before the word encompass the elements or things recited after the word and their equivalents, but do not exclude other elements or things. Words like "connected," "coupled" are not limited to physical or mechanical connections, but may include electrical connections, whether direct or indirect. "Up", "Down", "Left", "Right", etc. are only used to represent the relative positional relationship, and when the absolute position of the described object changes, the relative positional relationship may also change accordingly.

It will be understood that when an element such as a layer, film, region or substrate is referred to as being "on" or "under" another element, it can be "directly on" or "under" the other element, or an intermediate element may be present.

In the foregoing description of the embodiments, the particular features, structures, materials or characteristics may be combined in any suitable manner in any one or more of the embodiments or examples.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A pixel circuit, comprising: a driving circuit, a data writing-in circuit and a reset circuit, wherein
    the data writing-in circuit is respectively coupled to a first scan line, a data line and a second end of the driving circuit, and is configured to control to connect the data line and the second end of the driving circuit under the control of a first scan signal provided by the first scan line;
    the reset circuit is respectively coupled to a third scan line, a reset voltage line and the second end of the driving circuit, and the reset circuit is configured to: in a bias voltage compensation phase of a display period, control to connect the reset voltage line and the second end of the driving circuit under the control of a third scan signal provided by the third scan line to supply a reset voltage to the second end of the driving circuit, such that the second end of the driving circuit is reset before a data signal is written by the data writing-in circuit;
    the driving circuit is configured to control to connect the first end of the driving circuit and the second end of the driving circuit under the control of a potential of a control end of the driving circuit;

wherein the pixel circuit further comprises: a compensation control circuit, a first initialization circuit and a third initialization circuit;

the compensation control circuit is respectively electrically connected to a second scan line, the control end of the driving circuit and the first end of the driving circuit, and the compensation control circuit is configured to, in the bias voltage compensation phase of the display period, control to connect the control end of the driving circuit and the first end of the driving circuit under the control of a second scan signal provided by the second scan line;

the first initialization circuit is respectively coupled to the second scan line, a first initialization voltage line and a connection node, and the first initialization circuit is configured to, in the bias voltage compensation phase of the display period, control to connect the first initialization voltage line and the connection node under the control of the second scan signal;

the third initialization circuit is respectively coupled to a second light-emitting control line, the control end of the driving circuit and the connection node, and the third initialization circuit is configured to, in the bias voltage compensation phase of the display period, control to connect the control end of the driving circuit and the connection node under the control of a second light-emitting control signal provided by the second light-emitting control line;

wherein the pixel circuit further comprises: a light-emitting control circuit and a light-emitting element;

the light-emitting control circuit is respectively coupled to a first light-emitting control line, the first end of the driving circuit and the light-emitting element, and the light-emitting control circuit is configured to, in the bias voltage compensation phase of the display period, connect a first voltage line and the second end of the driving circuit under the control of the second light-emitting control signal; and the light-emitting control circuit is further coupled to a second light-emitting control line, the first voltage line and the second end of the driving circuit, respectively, and the light-emitting control circuit is configured to, in a light-emitting phase of the display period, control to connect the first voltage line and the second end of the driving circuit under the control of the second light-emitting control signal provided by the second light-emitting control line; and the driving circuit is configured to, in the light-emitting phase of the display period, drive, the light-emitting element to emit light.

2. The pixel circuit according to claim 1, wherein the pixel circuit further comprises an energy storage circuit;

the energy storage circuit is respectively coupled to the control end of the driving circuit and a first voltage line.

3. The pixel circuit according to claim 1, wherein the pixel circuit further comprises: a second initialization circuit;

the second initialization circuit is respectively coupled to the first scan line, the second initialization voltage line and the light-emitting element, and is configured to control to connect the second initialization voltage line and the light-emitting element under the control of the first scan signal.

4. The pixel circuit according to claim 3, wherein the second initialization circuit comprises a seventh transistor, a gate electrode of the seventh transistor is coupled to the first scan line, and a first electrode of the seventh transistor is coupled to the second initialization voltage line, and a second electrode of the seventh transistor is coupled to the light-emitting element.

5. The pixel circuit according to claim 1, wherein the compensation control circuit includes a first transistor, the first initialization circuit includes a second transistor, the driving circuit includes a third transistor, and the third initialization circuit including a ninth transistor;

a gate electrode of the first transistor is coupled to the second scan line, and a first electrode of the first transistor is coupled to a second electrode of the third transistor, a second electrode of the first transistor is coupled to a gate electrode of the third transistor;

a gate electrode of the second transistor is coupled to the second scan line, a first electrode of the second transistor is coupled to the first initialization voltage line, and a second electrode of the second transistor is coupled to the connection node;

a gate electrode of the ninth transistor is coupled to the second light-emitting control line, a first electrode of the ninth transistor is coupled to the connection node, and a second electrode of the ninth transistor is coupled to a gate electrode of the third transistor.

6. The pixel circuit according to claim 1, wherein the driving circuit comprises a third transistor, the data writing-in circuit comprises a fourth transistor, and the reset circuit comprises an eighth transistor;

a gate electrode of the fourth transistor is coupled to the first scan line, and a first electrode of the fourth transistor is coupled to the data line, a second electrode of the fourth transistor is coupled to a first electrode of the third transistor; and a gate electrode of the eighth transistor is connected to the third scan line, a first electrode of the eighth transistor is coupled to the reset voltage line, a second electrode of the eighth transistor is coupled to a first electrode of the third transistor or a second electrodes of the third transistor.

7. The pixel circuit according to claim 1, wherein the driving circuit comprises a third transistor, the light-emitting control circuit comprises a fifth transistor and a sixth transistor; the energy storage circuit comprises a storage capacitor;

a gate electrode of the fifth transistor is coupled to the second light-emitting control line, and a first electrode of the fifth transistor is coupled to the first voltage line, a second electrode of the fifth transistor is coupled to a first electrode of the third transistor;

a gate electrode of the sixth transistor is coupled to the first light-emitting control line, a first electrode of the sixth transistor is coupled to a second electrode of the third transistor, and a second electrode of the sixth transistor is coupled to the light-emitting element;

a first electrode plate of the storage capacitor is coupled to the first voltage line, and a second electrode plate of the storage capacitor is coupled to the gate electrode of the third transistor.

8. A display device comprising the display substrate according to claim 1.

9. The display device according to claim 8, wherein the pixel circuit further comprises: a compensation control circuit, a first initialization circuit and a third initialization circuit;

the compensation control circuit is respectively electrically connected to a second scan line, the control end of the driving circuit and the first end of the driving circuit, is configured to control to connect the control end of the driving circuit and the first end of the driving circuit under the control of a second scan signal provided by the second scan line;

the first initialization circuit is respectively coupled to the second scan line, a first initialization voltage line and a connection node, and is configured to control to connect the first initialization voltage line and the connection node under the control of the second scan signal;

the third initialization circuit is respectively coupled to a second light-emitting control line, the control end of the driving circuit and the connection node, and is configured to control to connect the control end of the driving circuit and the connection node under the control of a second light-emitting control signal provided by the second light-emitting control line.

10. A driving method, applied to the pixel circuit according to claim 1, wherein the display period includes the bias voltage compensation phase and a writing-in compensation phase, wherein the driving method comprises:

in the bias voltage compensation phase, controlling, by the reset circuit, to connect the reset voltage line and the second end of the driving circuit under the control of the third scan signal; or control to connect the reset voltage line and the first end of the driving circuit under the control of the third scan signal;

in the writing-in compensation phase, controlling, by the data writing-in circuit, to connect the data line and the second end of the driving circuit under the control of the first scan signal.

11. The driving method according to claim 10, wherein, in the bias voltage compensation phase, controlling, the first initialization circuit, to connect the first initialization voltage line and the connection node under the control of the second scan signal; controlling, by the third initialization circuit, to connect the control end of the driving circuit and the connection node under the control of the second light-emitting control signal; controlling, by the light-emitting control circuit, to connect the first voltage line and the second end of the driving circuit under the control of the second light-emitting control signal; controlling, by the compensation control circuit, to connect the control end of the driving circuit and the first end of the driving circuit under the control of the second scan signal;

the display period further includes the light-emitting phase after the writing-in compensation phase; the driving method further includes:

in the light-emitting phase, controlling, by the light-emitting control circuit, to connect the first voltage line and the second end of the driving circuit under the control of the second light-emitting control signal, and to connect the first end of the driving circuit and the light-emitting element under the control of the first light-emitting control signal, and driving, by the driving circuit, the light-emitting element to emit light.

* * * * *